United States Patent
Pentakota et al.

(10) Patent No.: US 6,906,658 B2
(45) Date of Patent: Jun. 14, 2005

(54) REDUCING DROOP IN A REFERENCE SIGNAL PROVIDED TO ADCS

(75) Inventors: Visvesvaraya A. Pentakota, Bangalore (IN); Gautam Salil Nandi, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/708,853

(22) Filed: Mar. 29, 2004

(65) Prior Publication Data

US 2005/0046604 A1 Mar. 3, 2005

Related U.S. Application Data

(60) Provisional application No. 60/498,494, filed on Aug. 28, 2003.

(51) Int. Cl.$^7$ .................................................. H03M 1/12
(52) U.S. Cl. ..................... 341/172; 341/118; 341/120; 341/150; 341/155
(58) Field of Search .................................. 341/118, 122, 341/150, 155, 172, 120

(56) References Cited

U.S. PATENT DOCUMENTS

| | | | | | |
|---|---|---|---|---|---|
| 5,184,127 A | * | 2/1993 | Myers | ........................ | 341/122 |
| 5,771,012 A | * | 6/1998 | Shu et al. | ................... | 341/118 |
| 6,249,240 B1 | * | 6/2001 | Bellaouar | ................... | 341/172 |
| 6,567,028 B2 | * | 5/2003 | Huang et al. | ............... | 341/155 |

* cited by examiner

Primary Examiner—Michael Tokar
Assistant Examiner—Khai Nguyen
(74) Attorney, Agent, or Firm—W. Daniel Swayze, Jr.; W. James Brady; Frederick J. Telecky, Jr.

(57) ABSTRACT

An aspect of the present invention reduces droop in the reference signal provided to ADCs. A compensation resistor of appropriate resistance value is provided in the path of the reference signal to minimize the droop.

12 Claims, 8 Drawing Sheets

REDUCING DROOP IN A REFERENCE SIGNAL PROVIDED TO ADCS

CROSS REFERENCE TO RELATED APPLICATIONS

The present invention claims priority from pending provisional application Ser. No. 60/498,494, Filed on: Aug. 28, 2003, entitled, "Piecewise linear calibration to correct transfer function errors of digital to analog converter", and is incorporated in its entirety herewith.

BACKGROUND OF INVENTION

1. Field of the Invention

The present invention relates to the design of analog to digital converters (ADC), and more specifically to a method and apparatus for reducing droop in a reference signal provided to an ADC.

2. Related Art

Analog to digital converter (ADC) generally refer to a component which converts an analog signal to a sequence of digital codes. In general, an ADC samples an input analog signal at specific time points, and generates corresponding digital codes. ADCs are thus generally used to provide a digital representation of the signal level of an input analog signal.

A reference signal (Vref) is often used by an ADC in providing such conversions. In general, Vref specifies the maximum input voltage that can be converted into a corresponding maximum digital code. In addition, assuming that each digital code contains N-bits, Vref is commonly divided into $2^N$ equal step sizes, and a sampled analog signal strength is compared with the step sizes to determine the digital code corresponding to the sampled analog signal strength.

Droop generally refers to the change/deviation from the ideal characteristics of the reference signal Vref. Droop (in the reference signal) commonly causes an error in the digital codes generated by an ADC as Vref is used to generate the digital codes, as noted above. Such errors in digital codes are generally undesirable in at least some scenarios. Accordingly, it is desirable to reduce droop in Vref provided to ADCs.

BRIEF DESCRIPTION OF DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of the present invention reduces the droop caused in a reference signal provided to an ADC, which is implemented using switched capacitors. In an embodiment, a capacitor with high capacitance may be connected to a node at which a reference buffer provides a reference signal to the ADC to reduce power consumption. However, the resistance inherent in the path from the capacitor to the node introduces droop into the reference signal received by the ADC.

The droop (including that introduced by the high capacitor) may be reduced by providing a resistor between the output of reference buffer and the node in the path of the reference signal to the ADC. Due to the reduction in the droop, the ADC may generate accurate digital codes representing an input analog signal. The reasons underlying the reduction in droop, and the manner in which an appropriate impedance value may be selected is described in sections below with examples.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well_known structures or operations are not shown in detail to avoid obscuring the invention.

2. Example Environment

Figure 1:
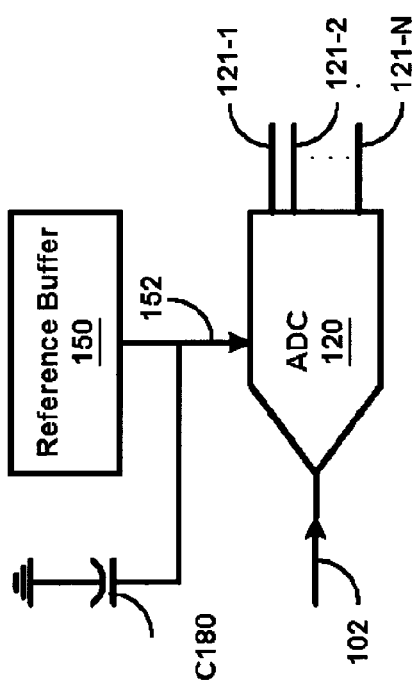
FIG. 1 is a block diagram illustrating an example environment in which the present invention may be implemented.

FIG. 1 is a block diagram illustrating an example environment in which various aspects of the present invention can be implemented. The block diagram is shown containing ADC 120, reference buffer 150, and external capacitor C180. The example environment is shown containing only a few components. However, a typical environment may contain more components as will be apparent to one skilled in the relevant arts. Each block is described in detail below.

ADC 120 generates an N-bit digital code (containing bits provided on path 121-1 through 121-N) corresponding to an analog input received on path 102. The value of each digital code is determined by the voltage level on reference signal 152. Accordingly, it is desirable that the reference signal be generated without any droops.

Reference buffer 150 along with capacitor C180 operate to provide reference signal 152. Such a combination is particularly useful for low power environments (i.e., consuming minimal power) as described in further detail below with reference to FIG. 5B.

However, the reference signal generated by such a combination may contain droop as described below in further detail with reference to example implementations. First, the operation of a pipe-line ADC (example of ADC 120) is described to understand the manner in which droop is caused due to switching capacitance.

3. Pipe-Line ADC

Figure 2:
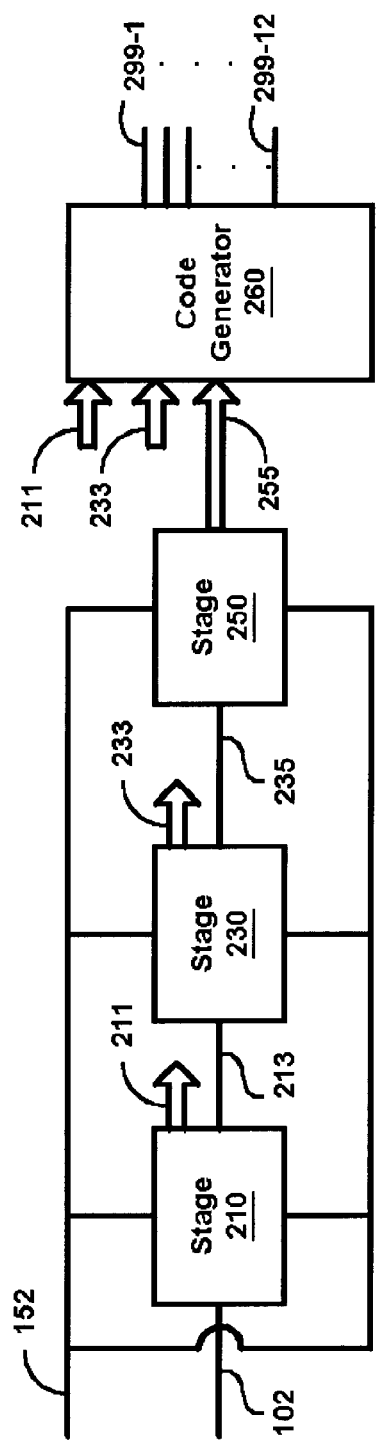
FIG. 2 is block diagram illustrating the details of a pipeline ADC in an embodiment.

FIG. 2 is a block diagram illustrating the details of ADC 120 in one embodiment. ADC 120 is shown containing multiple stages 210, 230 and 250, and code generator 260. Each block is described briefly below.

Each stage (210, 230 and 250) uses Vref 152 to generate a P-bit sub-code corresponding to a voltage level of an analog signal received as an input. For example, stage 230 coverts a voltage level on path 213 to generate a P-bit sub-code on path 233. The accuracy of P-bit digital code depends on the accuracy of the Vref, and thus needs to be constant and equal at all the stages. Code generator 260 generates the N-bit (corresponding to the voltage level on path 102) based on the sub-codes generated by stages 210, 230 and 250.

Each stage, except last stage 250, generates an output signal which represents ((Vi−Vdac)×Gain), wherein Vi represents the voltage level of the analog signal, Vdac equals ((sub-code×Vref)/$2^{P-1}$), with P representing the number of bits in the generated sub-code, gain equals $2^{P-1}$, − representing a subtraction operation, and × representing a multiplication operation. It may be helpful to understand that accuracy of Vdac (thus digital code) is based on accuracy of Vref. The manner in which each stage can be implemented is described below with reference to FIG. 3 in further detail.

Figure 3:
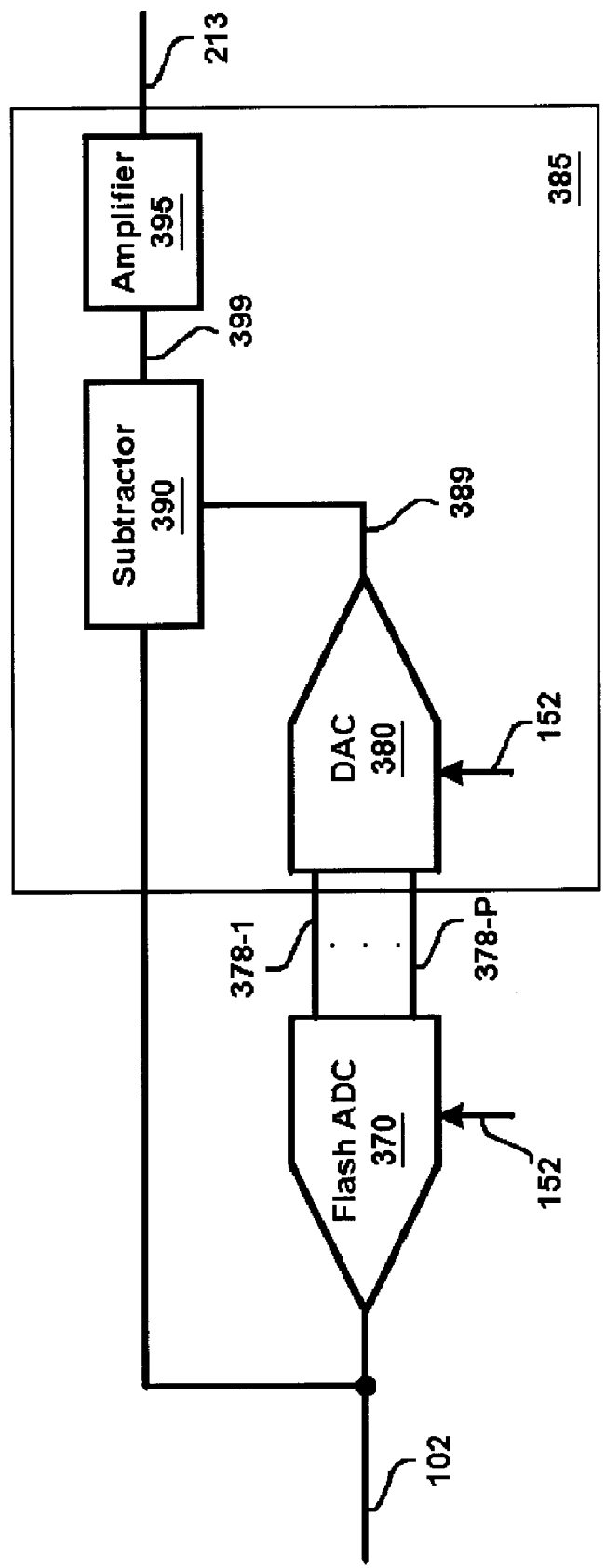
FIG. 3 is a block diagram illustrating the details of a stage in a pipe-line ADC in one embodiment.

FIG. 3 is a block diagram illustrating the details of stage 210 of ADC 120 in one embodiment. The description is provided with reference to stage 210 merely for illustration, however, stages 230 and 250 may also be implemented in a similar manner. Stage 210 is shown containing flash ADC 370, digital to analog converter 380, subtractor 390, and amplifier 395. Each block is described in detail below.

Flash ADC 370 (an example of a sub-ADC) converts a sample of the analog signal received on path 102 into a corresponding P-bit sub-code using Vref 152 received on path 152. The P-bit sub-code is provided on paths 378-1 through 378-P (contained in path 211 of FIG. 2, and P is less than N). Flash ADC 370 generates an approximate sub-code corresponding to analog signal.

Subtractor 390 generates the difference of the analog signal 102 (Vi) and the analog signal received on path 389 (Vdac). The difference voltage (Vi−Vdac) is provided on path 399. Amplifier 395 amplifies the difference voltage with a gain of $2^{P-1}$, wherein P represents the number of bits in the sub-code generated by stage 210. The amplified signal ((Vi−Vdac)×Gain) is provided on path 413 to resolve the remaining bits in the N-bit digital code by the next ADC stages. Thus, the last stage 250 may not contain DAC, subtractor and amplifier.

DAC 380 converts the sub-code received on paths 378-1 through 378-P into corresponding analog signal (Vdac) on path 389 using reference voltage provided on path 152. DAC 380 needs to generate Vdac such that the digital code is represented accurately. As is well known, the unresolved portion of the analog input (provided as input to next stage) is based on the accuracy of Vdac. The voltage Vref 152 thus needs to be accurate/at constant level without any droop as Vdac (on path 389) is generated based on Vref 152. The difference voltage (Vi−Vdac) is provided as input to the next stage.

Droop in Vref may cause an error in generation of Vdac and the same error may be provided as input to next stages of ADC 120. Error caused in generating Vdac due to Vref results in an error in the digital code generated by ADC 120. The manner in which DAC 380, subtractor 390 and amplifier 395 ("circuit 385") are implemented together is described below with reference to FIG. 4.

4. Implementation Using Capacitors

Figure 4:
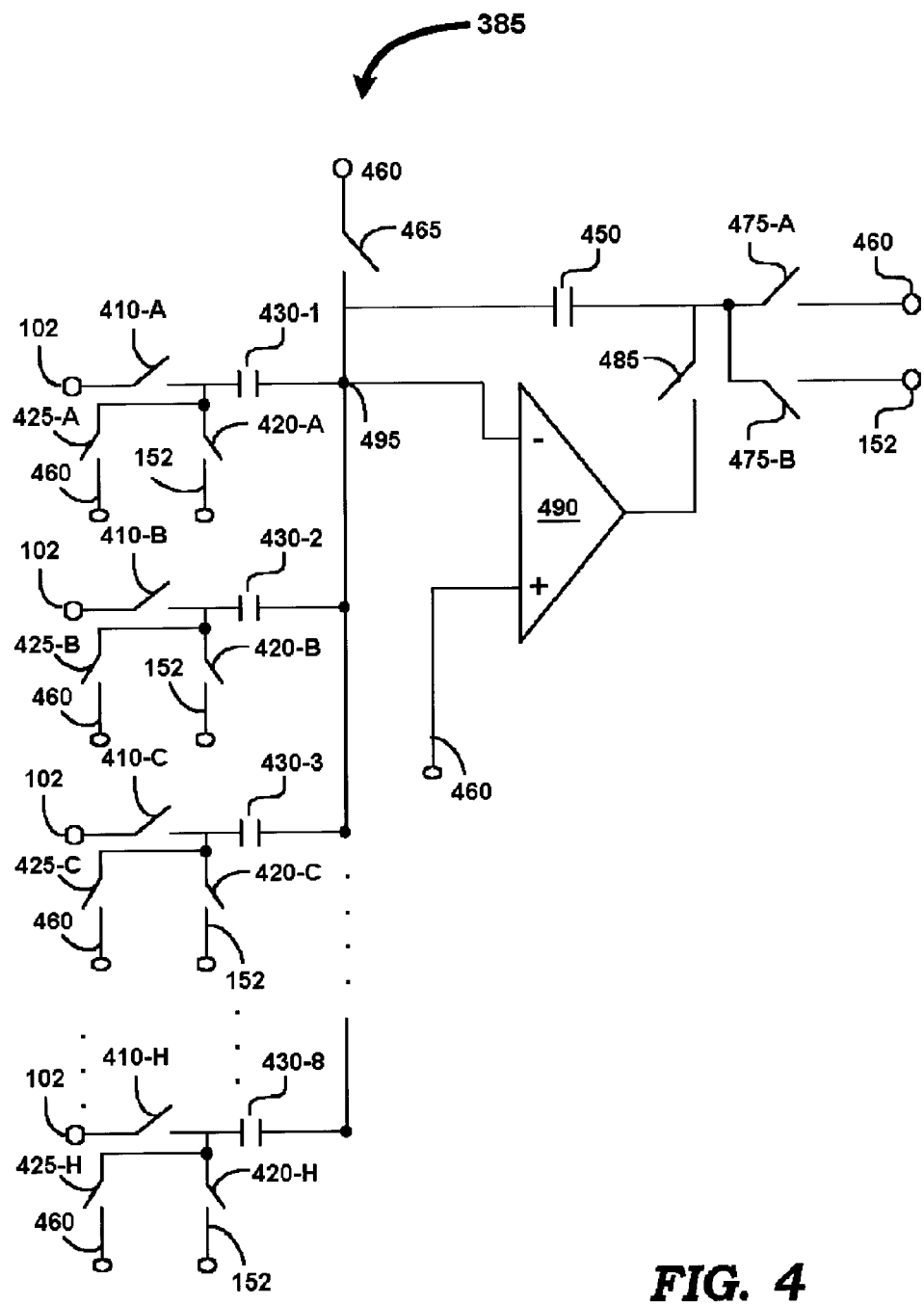
FIG. 4 is a circuit diagram illustrating the switching load of a stage in pipe-line ADC in one embodiment.

FIG. 4 is a circuit diagram illustrating the manner in which DAC 380, subtractor 390 and amplifier 395 together may be implemented using capacitors in one embodiment. Circuit 385 is shown containing input capacitors 430\_1 through 430\_8, feedback capacitor 450, switches 410\_A through 410\_H, 420\_A through 420\_H, 465, 475\_A and 475\_B and 485, and operational amplifier 490. Operational amplifier 490 is shown connected as a single ended amplifier for conciseness. However, operational amplifier 490 may be operated in differential mode as well. The operation of the circuit diagram of FIG. 4 is described below.

For illustration, it is assumed that stage 210 is implemented to provide P(=3) bit sub\_code. Circuit 385 is implemented using (2P=23=8) eight input capacitors 430\_1 through 430\_8. Inverting terminal (−) of operational amplifier 490 is shown connected to node 495, and non\_inverting terminal (+) is connected to common mode voltage 460. Node 495 may be connected to common mode signal 460 by operating (closing) 465. Node 495 is shown connected to eight input capacitors 430\_1 through 430\_8, feedback capacitor 450 and switch 465.

Input capacitor 430\_1 may be connected to Vin (by closing switch 410\_A), to Vref (on path 152 by closing 420\_A) or to common mode voltage (by closing switch 425\_A). The other input capacitors may also be similarly connected by closing the corresponding switches.

In general, each switch is closed to provide the connection, and opened to leave the corresponding path in a disconnected state.

Feedback capacitor 450 is shown connected to node 495 at one end. The same end may be connected to common mode signal 460 by closing switch 465. The other end of feedback capacitor 450 may be connected to each of Vref 152, common mode signal 460 and output terminal of operational amplifier 490 by closing respective switches 475\_B, 475\_A, and 485.

Operational amplifier 490 generates the amplified signal ((Vin\_Vdac)×Gain), as desired, by appropriate operation of various switches as described below in further detail. Broadly, the input signal Vin received on path 102 is sampled onto input capacitors 430\_1 through in one phase (N1 or sample phase) of a clock signal, and the subtraction (i.e., Vin\_Vdac) and amplification are performed in the other phase (N2 or hold phase). The details of operation in the two phases are described below in further detail.

In N1 ('sample phase'), 410\_A through 410\_H, 465 and 475\_A are closed (remaining switches are open). Thus, switches 410\_A through 410\_H respectively connect input capacitors 430\_1 through 430\_8 to Vin at one end, and switch 465 connects the other end of the input capacitors to common mode signal 460 (via node 495). As a result, each of input capacitors 430\_1 through 430\_8 samples voltage level of Vin (on path 102) during N1. Both ends of feedback capacitor 450 are connected to common mode signal 460 (via node 495 and via switch 475\_A), which discharges/resets the feedback capacitor.

In N2 ('hold phase'), a number of input capacitors equaling the value of the sub\_code are connected to Vref by closing the corresponding switches 420_A through 420_H, and the remaining input capacitors are connected to common mode voltage by closing the corresponding switches 425_A through 425_H. For example, if the sub_code equals a value of 3, switches 425_A through 425_C and 420_D through 420_H may be closed, and the remaining switches may be kept open. As a result, the voltage at node 495 ideally equals (Vin_Vdac).

In the hold phase, switch 485 is also closed, which causes amplifier 490 to amplify the voltage at node 495 by a factor equaling 8, assuming that all of the capacitors 430_1 through 430_8 and 450 have equal capacitance C. The switching of capacitors 430-1 through 430-H and 450 may cause the total switching load of ADC 120 to vary causing droop in Vref 152. The manner in which droop in Vref 152 is caused due to switching load is described below.

5. Droop in the Reference Signal Caused due to Switching Load of ADC

Figures 5A, 5B:
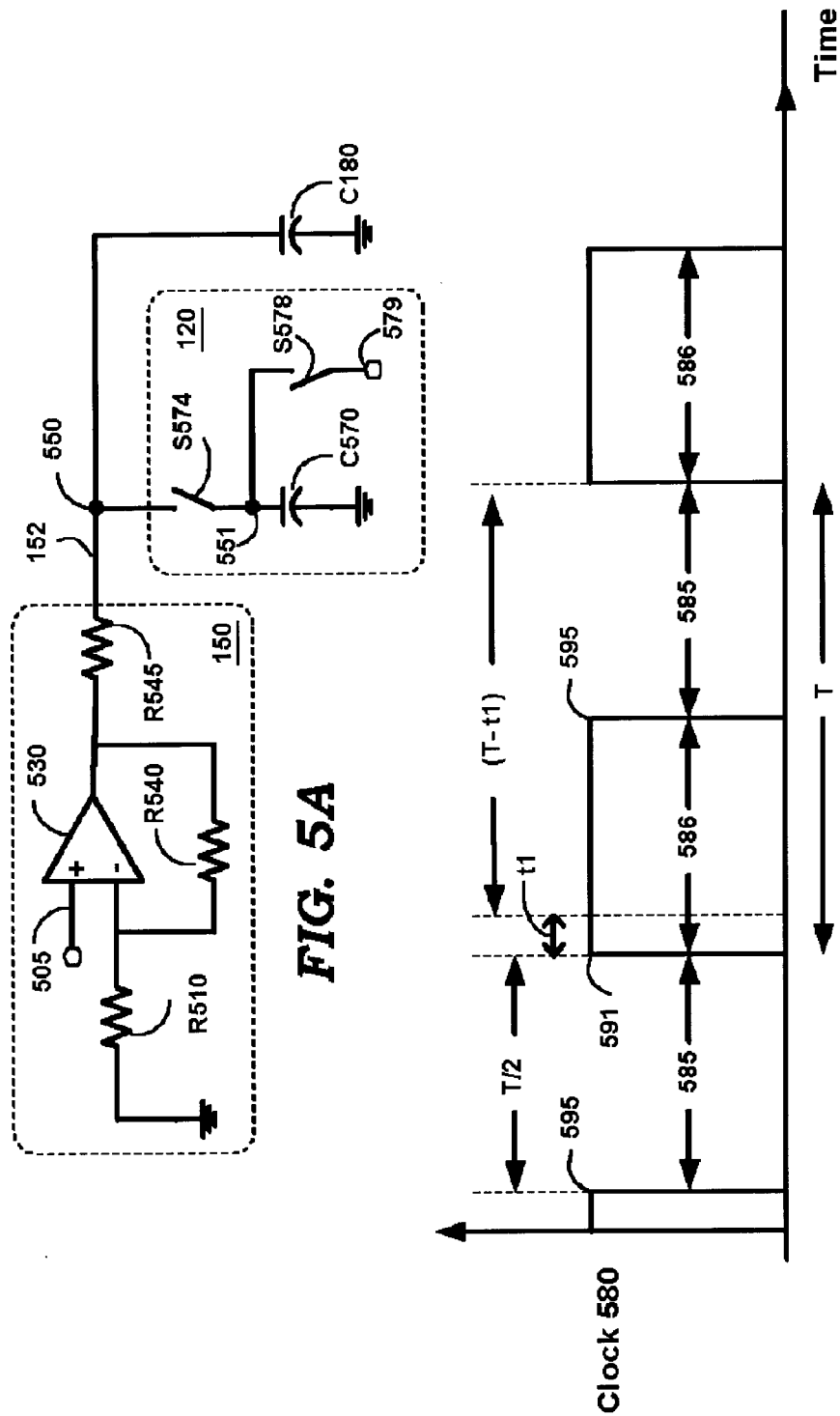
FIG. 5A is a circuit diagram illustrating the details of the manner in which a reference signal is provided to an ADC in one prior embodiment.
FIG. 5B is a timing diagram illustrating the operation of the reference buffer in the prior embodiment of FIG. 5A.

FIG. 5A contains a circuit diagram illustrating the manner in which a reference signal may be generated based on switched capacitor techniques in one embodiment. The circuit there is shown implemented using operational amplifier 530, input resistor R510, feedback resistor R540, routing resistor R545, C570 along with switches S574 and S578. As shown, operational amplifier 530 along with resistors R545, R510 and R545 form output buffer 150.

The load ("switching load") offered by ADC 120 during operation may be represented by an equivalent circuit of C570, S574, and S578. In general, switch S574 is turned on in one phase (sampling phase) and switch S578 is turned on during the other phase (hold phase). C570 represents the total sampling capacitance (i.e., sum of capacitances 430-1 through 430-8 in all the stages together) of the ADC stages receiving reference signal 152. One end of switching load C570 is shown connected to node 551 and the other end to ground point. Switch S574 is shown connected between node 550 and node 551, S578 is shown connected between node 551 and node 579.

Operational amplifier 530 receives (on path 505) a signal Vs (from voltage source, not shown) connected to non-inverting terminal (+) of the operational amplifier 530. Feedback resistor R540 is shown connected between output terminal and inverting terminal (−) of operational amplifier 530 and input resistance 510 is shown connected to inverting terminal.

Resistance R545 represents the sum of the routing resistance (Rrout) of the routing path connected to output terminal and the output resistance (Rout) of reference buffer 150. As is well known, reference buffer 150 can be represented by a voltage source Vs in series with output resistance Rout of reference buffer 150, generating a reference signal 152 (Vref). The description is continued with reference to a timing diagram illustrating the operation of the circuit diagram of FIG. 5A in further detail. The manner in which capacitor C180 is used to minimize power consumption is also described below in further detail.

FIG. 5B is a clock signal illustrating different time points corresponding to operation of the circuit of FIG. 5A. Clock 580 is shown generated with time period of each cycle equal to T (corresponding to a frequency 'f') with voltage level equaling logic 0 in durations 585 and logic 1 in durations 586. The operation is described with reference to different time points of clock signal 580. Clock 580 controls the state of various switches as described below.

In duration 585, S574 is open by falling edge of clock 580 at time point 595 disconnecting C570 from node 550 (referred to as no-load condition). Under no-load condition, zero average current (IavgC570) flows through C570. The average current (IavgC570) is depicted in Equation (1).

$$IavgC570=0 \qquad \text{Equation (1)}$$

The average voltage V1(avg) at node 550 equals average reference voltage Vref (avg), which in turn is equal to Vref as Iavg equals 0. The drop across Rout and R545 also equals 0 as Iavg flowing through Rout and R545 is zero. As a result, voltage levels at node 550 and output of the reference buffer 150 are equal. V1(avg) at node 550 is represented by Equation (2) below.

$$V1(avg)=Vref(avg)=Vref \qquad \text{Equation (2)}$$

Average voltage Vc(avg) across external capacitor C180 is also equal to V1(avg) as C180 is connected to node 550. Also, as switch 574 is open, C570 is disconnected from C180 (S578 is closed connecting C570 to voltage level V2, corresponding to voltage received on the input path or the output from the prior stage).

In duration 586, switch S574 is closed (and S578 is open) by rising edge of clock 580 at time point 591. C180 (at voltage Vc(avg)) charges C570 to V1(=Vc, instantaneous voltage level) from V2 in a small duration t1. As C180 is of higher value (e.g., 10 microfarad in one embodiment) compared to C570 (e.g., 2.2 picofarad), t1 is small and charge lost by C180 (in recharging C570 from V2 to V1) in every cycle of clock 580 is also small. Due to substantially small change in the voltage across C180, the voltage across C180 (Vc (avg) which equals V1(avg)) is assumed to be constant. The amount of charge (ΔQ) lost by C180 (gained by C570) is shown in Equation (3).

$$\Delta Q=(V1-V2) \times C570 \qquad \text{Equation (3)}$$

wherein 'x' represents a multiplication operator.

During (T−t1), a small average dc current 'IavgC180' provided by reference buffer 150 flows through C180 and replenishes the lost charges. In a steady state, the charge lost by C180 in every cycle to recharge C570 is equal to charge replenished due to average dc current (IavgC180) provided by reference buffer 150. IavgC180 provided by reference buffer 150 is as shown in Equation (4) below.

$$IavgC180=(V1-V2) \times C570 \times f \qquad \text{Equation (4)}$$

wherein f represents the frequency (=1/T) of clock 580.

As IavgC180 flows through Rout and R545, a voltage drop equal to IavgC180×(Rout+R545) is caused across Rout and R545. Vref equals the sum of drop across (Rout+R545) and V1(avg) at node 550 (or across C180), which is shown in Equation (5) below.

$$Vref=V1(avg)+(IavgC180 \times (Rout+R545)) \qquad \text{Equation (5)}$$

Rearranging Equation (5), V1(avg) at node 550 is as shown in Equation (6) below.

$$V1(avg)=Vc(avg)=Vref-(IavgC180 \times (Rout+R545)) \qquad \text{Equation (6)}$$

Examining Equation (6), it may be understood that the V1(avg) at node 550 is less than Vref by voltage equal to (IavgC180×(Rout+R545)). ADC 120 samples V1(avg) (instead of Vref) across C570 at time point 595 and converts an input analog signal into corresponding digital code. The deviation (Vref−V1(avg)) of V1(avg) from Vref is referred to 'average droop'. The average droop is as shown in Equation (7) below.

$$\text{Average Droop} = V_{ref} - V1(avg) = I_{avgC180} \times (R_{out} + R545) \quad \text{Equation (7)}$$

The digital code generated by ADC 120 contains error as V1(avg) is less than Vref, and thus the digital codes may be generated with errors.

Capacitor C180 may be implemented with a large (e.g., 1 to 10 microfarad) capacitance, to minimize power consumption. In particular, capacitor C180 quickly charges capacitor C570 in duration t1, and is then recharged slowly in the remaining duration (T−t1) by reference buffer 150. As the recharge duration is long, buffer 150 need not be implemented with a high drive strength, thereby minimizing the power requirement. As a result, settling of DAC 380 does not depend on reference buffer 150.

It may be further appreciated that capacitor C180 is shown connected to node 550 without any resistor(s) in between. Such a configuration corresponds to an ideal scenario, but several resistors may be present in a realistic scenario. For example, assuming that ADC 120 and reference buffer 150 are provided in a single integrated circuit, node 550 represents a bond pad, and that capacitor C180 is connected to the bond pad by a pin, several resistor components may be present in the path between capacitor C180 and node 550.

For example, the resistor components may include the resistance associated with non-ideal capacitor C180, the resistance of the routing path between the IC pin and C180, resistance of the IC pin, resistance of the routing path between IC pin and the bond pad (at node 550) and the resistance of the bond pad. The sum of all the resistance (of bondwire, IC pin, PCB trace, and series resistance of C180) values between node 550 and capacitor 180 may be referred to as effective series resistance (ESR). In general, as described below, ESR causes droop in the reference signal. The description is continued with reference to analysis considering ESR (represented by R640).

6. Droop in the Reference Signal Caused due to Effective Series Resistance (ESR)

Figure 6A:
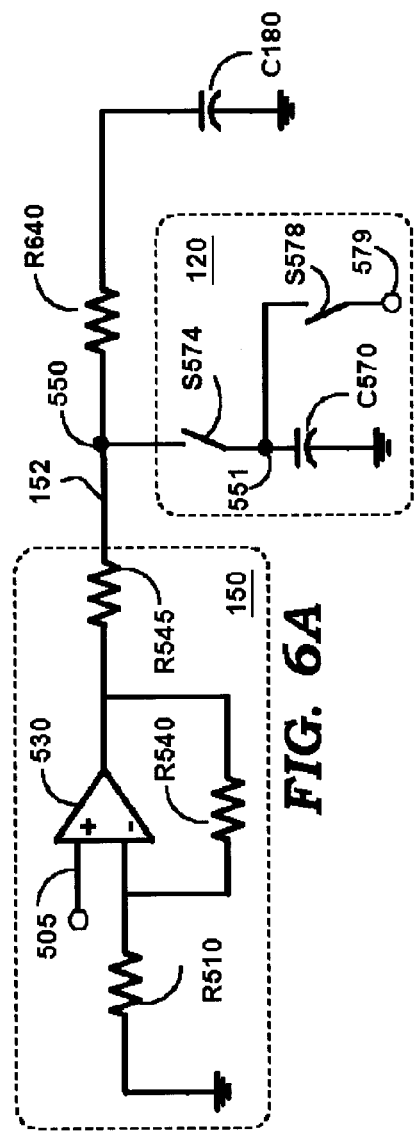
FIG. 6A is a circuit diagram illustrating the details of the manner in which a reference signal is provided to an ADC in another prior embodiment.

FIG. 6A is a circuit diagram illustrating the operation of reference buffer 150 in the presence of ESR in one prior embodiment. The circuit diagram is shown containing R640 (effective series resistance) connected in series with C180, and all other components contained in FIG. 5A. The droop (referred to as 'effective droop') caused due to R640 is described with respect to FIG. 6B below.

Figure 6B:
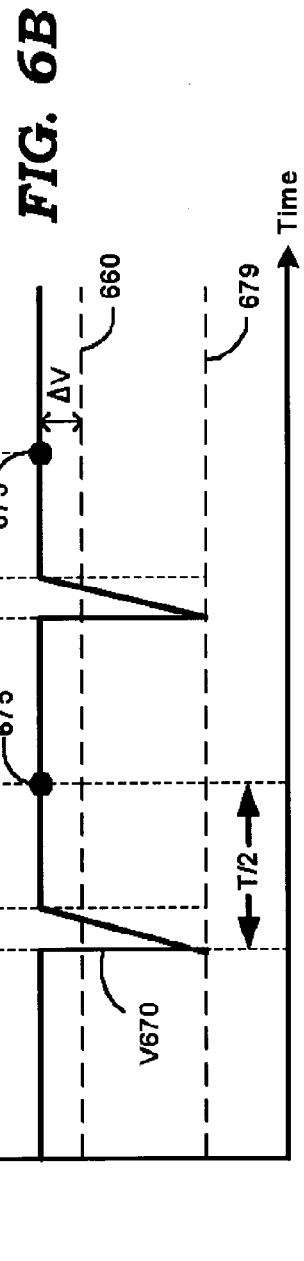
FIG. 6B is a timing diagram illustrating the effective droop in the output of reference buffer in the embodiment of FIG. 6A.

FIG. 6B is a timing diagram illustrating the droop caused due to R640 in one embodiment. Timing diagram is shown containing lines 660 and 679 respectively representing voltage levels V1(avg)(=Vref according to Equation (2)) at node 550, and V2 at node 579. Waveform V670 depicts the change in voltage level at node 550 as a function of time. Determination of effective droop is described below with reference to FIGS. 1, 5A, 5B and 6A.

At time point 591, V670 is shown falling quickly to V2 in response to closing of switch S574. The voltage drops quickly since C570 is connected to node 550, and voltage level across C570 equals V2 (of node 579) prior to closing switch S574. V670 continues to rise sharply thereafter as capacitor 180 continues charging. Eventually, voltage level across C570 rises from V2 to V1 (in duration t1).

During (T−t1), an average dc current I_avgC180 flows through C180 (via R_out, R545, and R640) to replenish the charges lost by C180 in duration t1. Now the instantaneous voltage V1(T−t1) at node 550 equals sum of instantaneous voltage Vc across C180 and voltage drop across R640. V1(T−t1) is as shown in Equation (8) below.

$$V1(T-t1) = V_c + I_{avgC180} \times R640 \quad \text{Equation (8)}$$

The instantaneous voltage Vc across C180 is approximately equal to average voltage Vc(avg) (i.e., Vc=Vc(avg)) in steady state. The value of Vc(avg) is provided above with reference to Equation (6). for Vc by Vc(avg) in Equation (8) the resulting expression for instantaneous voltage V1(T−t1) is shown in Equation (9).

$$V1(T-t1) = V_c(avg) + I_{avgC180} \times R640 \quad \text{Equation (9)}$$

Substituting for Vc (avg) (from Equation (6)) in Equation (9), the resulting Equation (10) is shown below.

$$V1(T-t1) = V_{ref} - I_{avgC180} \times (R_{out} + R545) + I_{avgC180} \times R640 = V_{ref} + I_{avgC180} \times (R640 - R_{out} - R545) \quad \text{Equation (10)}$$

By examining Equation (10), it may be noted that V1(T−t1) is greater than Vref and ADC 120 samples V1(T−t1) at time point 595 (or 675) instead of Vref. The resulting digital code generated by ADC 120 thus, contains error.

Effective droop ΔV (difference between Vref and V1(T−t1) at node 550) is as shown in Equation (11) below.

$$\text{Effective droop} = I_{avgC180} \times (R640 - R_{out} - R545) \quad \text{Equation (11)}$$

As the value R640 is substantially greater than (R_out+R545) (typically, R_out and R545 respectively equal few milli-ohms of resistance and R640 equals few ohms of resistance) the voltage drop across (R_out+R545) is small compared to voltage drop across R640. Applying the above approximation in Equation (11), the resulting expression for effective droop is shown in Equation (12) below.

$$\text{Effective droop} (\Delta V) = I_{avgC180} \times R640 \quad \text{Equation (12)}$$

It may be understood that voltage V1(T−t1) at node 550 deviates from Vref by a value equal to ΔV. The voltage at node 550 due to presence of R640 is greater than Vref and is of opposite polarity as compared to voltage at node 550 prior to considering R640.

Thus, by examining Equation (10), it may be noted that V1(T−t1) at node 550 is greater than Vref and ADC 120 samples V1(T−t1) instead of Vref at time point 595 (or 675). The resulting digital code generated by ADC 120 contains error and is undesirable at least in some scenarios. The description is continued with reference to the principle used to minimize effective droop in reference signal 152.

7. Principle

Figure 7:
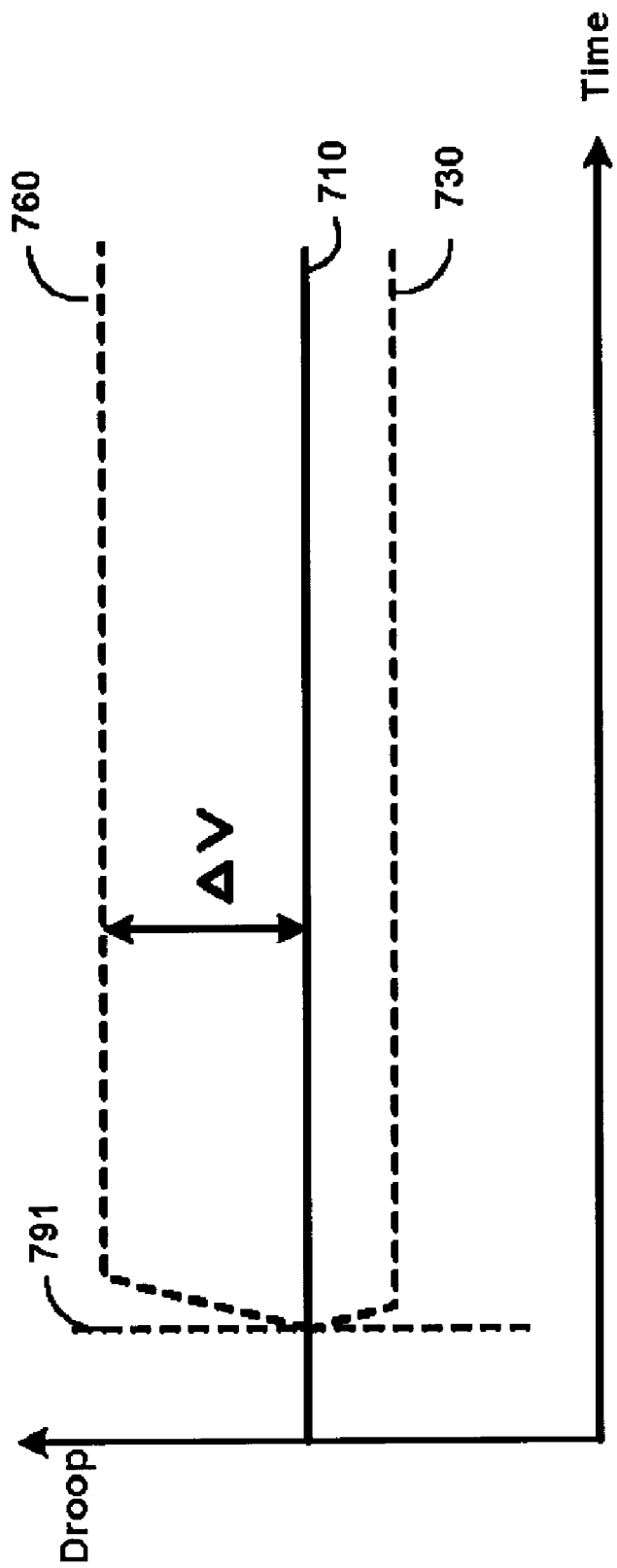
FIG. 7 is a timing diagram illustrating the principle using which effective droop may be minimized substantially according to an aspect of the present invention.

FIG. 7 is a graph illustrating the principle employed in minimizing the droop according to several aspects of the present invention. Droop caused due to several factors described above are represented by different lines (730, and 760) shown deviating from Vref (represented by line 710). For clarity, deviation caused due to different factors are shown with reference to time point 791 which corresponds to a point at which reference signal 152 (Vref) is connected to switching load of ADC 120 and C180.

Line 710 represents an ideal scenario in which no droop is caused when reference buffer 150 is driving a load, line 730 represents the average droop (represented by Equation (7)) caused only due to switching load C570 (as described above with reference to FIGS. 5A and 5B), and line 760 represents the effective droop (represented by Equation (12)) in the prior approach noted above with reference to FIGS. 6A and 6B.

It may be helpful to understand that the droops caused by switching load and effective series resistance (ESR) are opposite in polarity, and thus tend to negate/cancel each other. The magnitude of droop caused by the switching load is lesser in magnitude compared to that caused by ESR (as value R640 is greater than (Rout+R545)). Thus, the composite droop due to the simultaneous operation the switching load and ESR would cause the reference voltage on path 152 to be greater than ideal reference voltage. The difference is represented by ΔV as shown.

Examining Equation (10), it may be appreciated that a resistor (Radd) can be connected in series with (Rout+R545) to minimize ΔV. The value of Radd may be determined such that the magnitude of average droop (of line 730) causes a substantial decrease in the effective droop. By including Radd in Equation (13) and equating Equation (13) to zero, the value of Radd required to reduce the droop may be determined as shown below.

Effective droop=
$$IavgC180 \times (R640-Radd-Rout-R545)=0 \quad \text{Equation (13)}$$

Re-arranging Equation (13), an expression for Radd may be derived and is as shown in Equation (14).

$$IavgC180 \times R640 - IavgC180 \times Radd - IavgC180 \times Rout - IavgC180 \times R545 = 0 \; IavgC180 \times Radd = IavgC180 \times (R640-Rout-R545) \; Radd = R640-Rout-R545 \quad \text{Equation (14)}$$

An appropriate estimate of R640, Rout, and R545 may be used to compute Radd, such that effective droop (ΔV) potentially equals zero. The manner in which such a resistor (or resistance) can be used is described below with reference to FIG. 8 below.

8. Implementation

Figure 8:
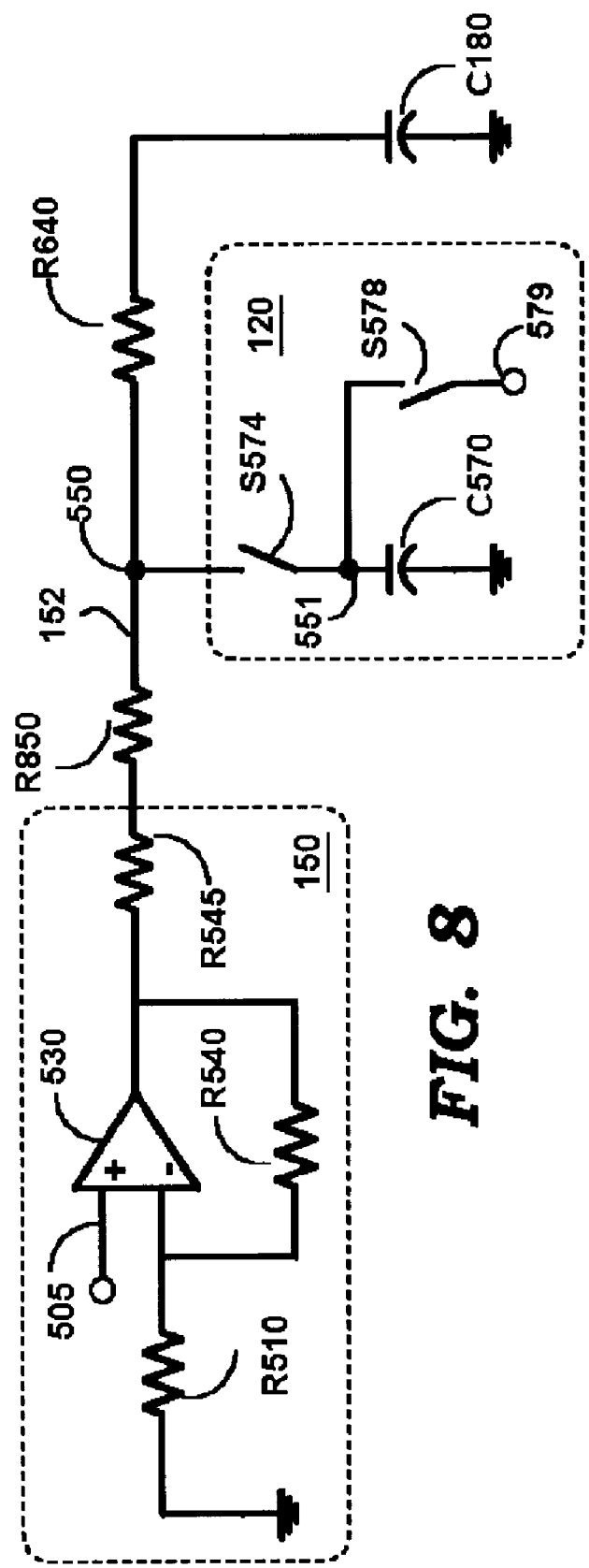
FIG. 8 is a circuit diagram illustrating the details of a reference buffer implemented according to an aspect of the present invention.

FIG. 8 is a circuit diagram of reference buffer 150 implemented according to an aspect of the present invention. Only the differences from the circuit diagram of FIG. 6A are described for conciseness.

Reference buffer 150 is shown containing R850 connected to the output of reference buffer 150 in series with Rout and 545, but before node 550. The value of R850 (=Radd) may be computed by using Equation (14). It should be understood that different considerations suitable for specific environments may be used in determining the resistance value of R850.

By connecting Radd in series with the output terminal of reference buffer 150 between one end of R545 and node 550, the effective droop may be reduced potentially to zero/small value. The value of R850 generally being small (potentially of the order of only a few ohms) may be implemented in a substantially small die area and thus integrated into the same integrated circuit (die) along with ADC 120 and reference buffer 150.

The description is continued with reference to an example device/system implemented according to an aspect of the present invention.

9. Example Device/System

Figure 9:
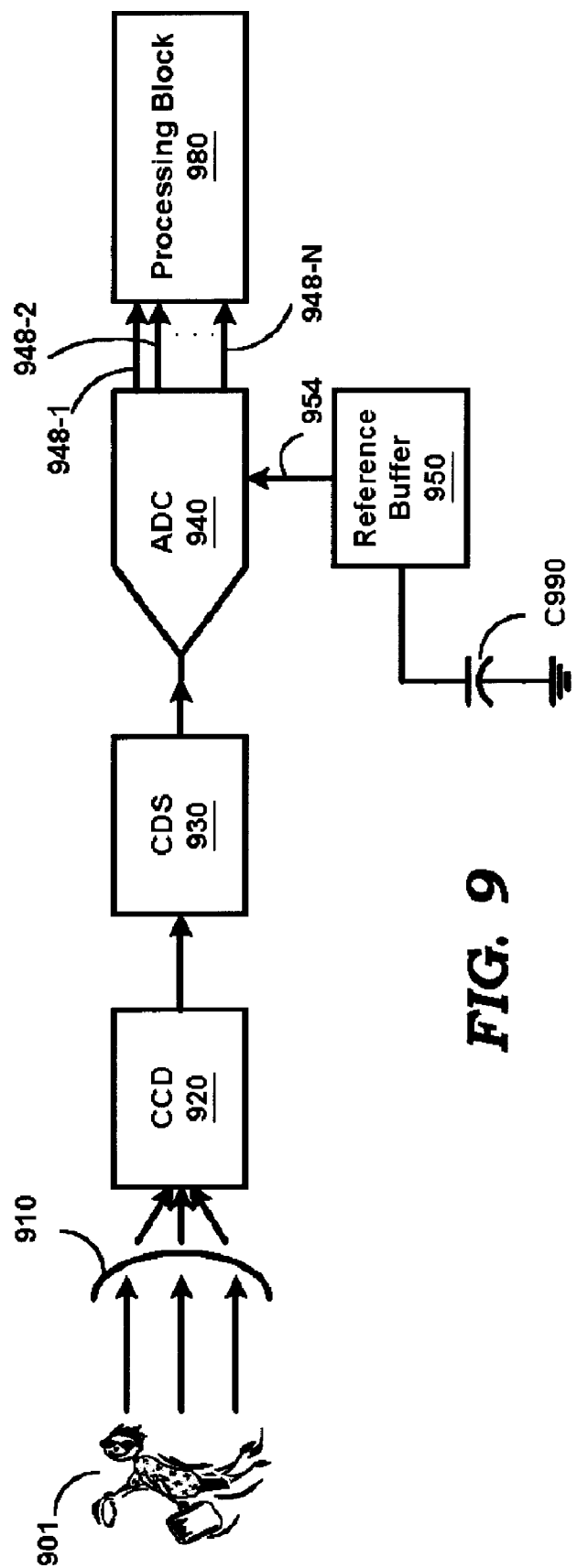
FIG. 9 is a block diagram illustrating an example environment in which various aspects of the present invention can be implemented.

FIG. 9 is a block diagram illustrating the details of an example device/system implemented according to an aspect of the present invention. Camera 900 is shown containing lens 910, charge coupled device (CCD) 920, correlated double sampling(CDS) block 930, ADC 940, reference buffer 950, and processing block 980. Each block is described in detail below.

Lens 910 focuses the light rays received from object 901 onto CCD 920. Merely for conciseness, only a single lens is shown. Multiple lens are typically present, for example, to filter and focus the corresponding color component in many embodiments. CCD 920 captures the image of object 901. Lens 910 and CCD 920 may be implemented in a known way.

CDS block 930 receives voltage signals representing each pixel according to correlation double sampling (CDS) technique well known in the relevant arts, and generates a voltage level representing each pixel. Signals with voltage levels representing the individual pixels are provided to ADC 940. CDS block 930 may be implemented in a known way.

ADC 940 converts the received voltage levels to corresponding digital codes based on the reference signal provided by reference buffer 950. Each digital code is provided on paths 948-1 through 948-N. The accuracy of conversion (of an input signal into digital code) is based on the accuracy of the reference signal received from reference buffer 950.

Reference buffer 950 provides a reference signal to ADC 940 on path 954. The reference signal provided to ADC 940 needs to be at constant voltage level. ADC 940 and reference buffer 950 may be implemented according to various principles described above. In particular, by adding a resistor of appropriate impedance in the path of the reference voltage provided to the ADC, droop in the reference signal may be minimized.

Reference buffer 950 and ADC 940 are shown as separate blocks for conciseness only, however, both the blocks may be implemented in a single integrated circuit and a large valued capacitor C990 may be connected external to IC.

Processing block 980 receives digital codes generated by ADC 940 and performs processing such as digital filtering etc., to provide a well defined image of the captured object to an user. The operation of processing block 980 depends on the specific device in which it is implemented. Processing block 980 may be implemented in a known way. The image may accurately represent object 901 due to the reduction of droop in the reference signal.

10. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A circuit comprising:
    a reference buffer providing a first voltage signal on an output terminal;
    a capacitor having a large capacitance connected to a first node;
    an analog-to-digital converter (ADC) implemented using switched capacitors, said ADC receiving a reference signal from said first node; and
    a resistor connecting said output terminal to said first node, whereby said reference signal is generated from said first voltage signal, whereby said resistor minimizes a droop which may otherwise be presented in said reference signal.

2. The circuit of claim 1, wherein a resistance value of said resistor substantially equals (A–B–C), wherein A equals a resistance present between said capacitor and said first node, B equals an output resistance of said reference buffer, and C equals a routing resistance between said output terminal and said first node.

3. The circuit of claim 2, wherein said reference buffer comprises an operational amplifier having two input terminals and said output terminal, wherein said B equals output resistance of said operational amplifier.

4. The circuit of claim 3, wherein said two input terminals comprise an inverting terminal and a non-inverting terminal, one of said two input terminals being connected to a voltage source.

5. The circuit of claim 2, wherein said ADC and said reference buffer are provided on an integrated circuit, said capacitor being provided external to said integrated circuit and being connected to said integrated circuit by a bond pad using a pin, said A containing a sum of resistance values of resistance associated with said capacitor, resistance of the routing path between said pin and said capacitor, resistance of said pin, resistance of the routing path between said pin and said bond pad, and resistance of said bond pad.

6. A device comprising:

a reference buffer providing a first voltage signal on an output terminal;

a capacitor having a large capacitance connected to a first node;

an analog-to-digital converter (ADC) implemented using switched capacitors, said ADC receiving a reference signal from said first node;

a resistor connecting said output terminal to said first node, whereby said reference signal is generated from said first voltage signal, whereby said resistor minimizes a droop which may otherwise be presented in said reference signal; and a processing block processing said digital code.

7. The device of claim 6, wherein said device comprises a camera, said camera further comprising:

a lens for focusing light signal reflected by an object;

a charge coupled device (CCD) storing charges based on the intensity of said light signal in a plurality of pixels corresponding to said object; and a correlated double sampler (CDS) generating voltage levels corresponding to said plurality of pixels, wherein said voltage levels are sampled by said ADC.

8. The camera of claim 7, wherein said reference buffer and said ADC is implemented in an integrated circuit (IC).

9. The device of claim 6, wherein a resistance value of said resistor substantially equals (A−B−C), wherein A equals a resistance present between said capacitor and said first node, B equals an output resistance of said reference buffer, and C equals a routing resistance between said output terminal and said first node.

10. The device of claim 6, wherein said reference buffer comprises an operational amplifier having two input terminals and said output terminal, wherein said B equals output resistance of said operational amplifier.

11. The circuit of claim 10, wherein said two input terminals comprise an inverting terminal and a non-inverting terminal, one of said two input terminals being connected to a voltage source.

12. The circuit of claim 6, wherein said ADC and said reference buffer are provided on an integrated circuit, said capacitor being provided external to said integrated circuit and being connected to said integrated circuit by a bond pad using a pin, said A containing a sum of resistance values of resistance associated with said capacitor, resistance of the routing path between said pin and said capacitor, resistance of said pin, resistance of the routing path between said pin and said bond pad, and resistance of said bond pad.

* * * * *